United States Patent [19]

Asakura

[11] Patent Number: 5,303,183

[45] Date of Patent: Apr. 12, 1994

[54] SEMICONDUCTOR MEMORY DEVICE

[75] Inventor: Mikio Asakura, Hyogo, Japan

[73] Assignee: Mitsubishi Denki Kabushiki Kaisha, Tokyo, Japan

[21] Appl. No.: 705,812

[22] Filed: May 29, 1991

[30] Foreign Application Priority Data

May 30, 1990 [JP] Japan .................. 2-142193
Apr. 15, 1991 [JP] Japan .................. 3-082348

[51] Int. Cl.⁵ .......................................... G11C 11/24
[52] U.S. Cl. .................................. 365/149; 365/203; 365/230.01
[58] Field of Search ................. 365/149, 154, 63, 210, 365/230.01, 203

[56]  References Cited

U.S. PATENT DOCUMENTS

| 4,982,367 | 1/1991 | Miyatake | 365/210 |
| 5,051,954 | 9/1991 | Toda et al. | 365/149 |
| 5,138,578 | 8/1992 | Fujii | 365/149 |

FOREIGN PATENT DOCUMENTS 60-164989 8/1985 Japan .
60-239993 11/1985 Japan .

Primary Examiner—Rolf Hille
Assistant Examiner—Roy Potter
Attorney, Agent, or Firm—Lowe, Price, LeBlanc & Becker

[57]  ABSTRACT

In the case where information is read from a selected memory cell, the transfer gate included in the memory cell is turned on, and one electrode of the memory cell capacitor is connected to one bit line of a corresponding bit line pair. At the same time, the other electrode of the memory cell capacitor, i.e. the cell plate electrode is connected to the other bit line of the corresponding bit line pair. As a result, a change of the potentials occur at both the bit lines of the corresponding bit line pair. This change of the potentials acts in the different directions between one bit line and the other bit line. Therefore, the read potential difference appearing on the bit line pair becomes larger, and malfunction of the sense amplifier is reduced, while the incidence of soft error can be reduced.

9 Claims, 13 Drawing Sheets

SEMICONDUCTOR MEMORY DEVICE

BACKGROUND OF THE INVENTION

1. Field of the Invention

The present invention relates to semiconductor memory devices, and more particularly, to a semiconductor memory device in which read information is detected by amplifying the potential difference appearing in each bit line pair.

2. Description of the Background Art

FIG. 9 is a block diagram showing the whole structure of a conventional general dynamic random access memory (hereinafter referred to as DRAM). In the diagram, signal input terminals 2, 3 and 4 are provided on the periphery of a semiconductor chip 1. A row address signal RA and a column address signal CA are supplied as inputs from signal input terminal 2 in a time sharing manner. A row address strobe signal /RAS is supplied as an input from signal input terminal 3. A column address strobe signal /CAS is supplied as an input from signal input terminal 4. A row address buffer 5 fetches the row address signal, supplied as an input, in synchronism with the row address strobe signal /RAS, and holds the row address signal. A column address buffer 6 fetches the column address signal, supplied as an input, in synchronism with the column address strobe signal /CAS and holds the column address signal. The row address signal RA0 - RAn held in row address buffer 5 is supplied to a row address decoder RD. The row decoder RD decodes the supplied row address signal RA0 - RAn and selectively drive a word line in a memory cell array MCA. The least significant bit signal RA0 of the row address signal RA0 - RAn is supplied to a selector circuit 7. The selector circuit 7 is responsive to the least significant bit signal RA0 and selectively drives either of the dummy word lines DWLe and DWLo. These dummy word lines DWLe and DWLo are connected to the memory cell array MCA. A plurality of bit line pairs BL, /BL are provided, crossing a plurality of word lines, in the memory cell array MCA. A sense amplifier SA, for example, of the structure as shown in FIG. 11 is provided to each bit line pair. Moreover, each bit line pair BL, /BL is connected, through transfer gates Q1, Q2 each implemented with a N channel MOS transistor, to a data input/output line pair IO, /IO. On the other hand, the column address signal CA0 - CAn held in column address buffer 6 are supplied to a column decoder CD. The column decoder CD decodes the supplied column address signal CA0 - CAn and selectively turns on a transfer gate pair of the plurality of transfer gate pairs Q1, Q2. The data input/output line pair IO, /IO is connected to an IO buffer 8. The IO buffer 8 is connected to a data input/output terminal 9 provided on the periphery of semiconductor chip 1. More specifically, IO buffer 8 performs inputting/outputting of data between data input/output terminal 9 and the data input/output line pair IO, /IO.

Moreover, the row address strobe signal /RAS and the column address strobe signal /CAS which are input to signal input terminals 3, 4 are supplied to a clock generating circuit 10. The clock generating circuit 10 is responsive to the supplied row address strobe signal /RAS and column address strobe signal /CAS to output clock signals BLPR, $\phi$s and /$\phi$s. The clock signal BLPR is supplied to the memory cell array MCA. The clock signals $\phi$s, /$\phi$s are supplied to the gates of transistors 11, 12 which cause the sense amplifiers SA to change in the active state.

FIG. 10 is a circuit diagram showing in more detail the memory cell array and its peripheral circuits extracted from the conventional DRAM shown in FIG. 9. In FIG. 10, a plurality of bit line pairs BL, /BL are arranged, crossing a plurality of word lines WL in the memory cell array MCA. Memory cells MC are connected to the crossings of each bit line pair BL, /BL and each word line WL. Each memory cell MC includes a transfer gate TG implemented with a N channel MOS transistor and a memory cell capacitor Cs in which information of a high level or "H", or low level or "L" is stored as a charge. A voltage Vcp is applied from a common power source (not shown), through a cell plate line CPL, to one electrode (cell plate electrode) of the memory cell capacitor Cs of each memory cell MC. Moreover, dummy word lines DWL0, DWL1 are arranged, crossing the bit line pairs BL, /BL. A dummy cell DC0 is provided at the crossing of the dummy word line DWL0 and each bit line BL, and a dummy cell DC1 is provided at the crossing of the dummy word line DWL1 and each bit line /BL. Each of the dummy cells DC0 and DC1 has the same structure as that of the memory cells MC and holds the intermediate voltage between the supply voltage Vcc and the ground voltage.

Furthermore, a sense amplifier SA is connected to each bit line pair BL, /BL. The plurality of word lines WL are connected to a row decoder RD. The dummy word lines DWL0, DWL1 are connected to a selector circuit 7. The bit line pairs BL, /BL are connected, through the transfer gates Q1, Q2 each implemented with a N channel MOS transistor, to the data input/output line pair IO, /IO. The gates of the transfer gates Q1, Q2 are connected to the column decoder CD.

Furthermore, each bit line BL is connected, through a transfer gate $T_{EQ}1$ implemented with a N channel MOS transistor, to a precharge line 13. Each bit line /BL is connected, through a transfer gate $T_{EQ}2$ implemented with a N channel MOS transistor, to a precharge line 13. A precharge voltage of Vcc/2 is applied to precharge line 13. A clock signal BLPR is applied from the clock generating circuit 10 shown in FIG. 9 to the gate of each of the transfer gates $T_{EQ}1$, $T_{EQ}2$.

When data is read, a word line WL is selected by the row decoder RD, and the potential of the word line WL is raised to "H". This causes the data in the memory cell MC connected to the word line WL to be read onto the bit line BL or /BL. For example, when the data is read onto the bit line BL, the potential of the dummy word line DWL1 is raised to "H", and the potential in the dummy cell DCl is read onto the bit line /BL. This causes the potential of the bit line /BL to become a reference potential Vref. On the other hand, the potential of the bit line BL becomes slightly higher or lower than the reference potential Vref according to the read out data. Then, the potential difference between the bit lines BL and /BL is amplified by a sense amplifier SA. Any one pair of transfer gates Q1, Q2 are turned on by a column decoder CD, and the data on the bit line pair BL, /BL connected to the pair of transfer gates Q1, Q2 is read onto the data input/output line pair IO, /IO.

Now, the potential appearing on each bit line pair BL, /BL during the read operation is considered. Let the capacitance value of the memory cell capacitor Cs of the memory cell MC be Cs. The charge stored in the memory cell MC becomes $C_s \cdot (Vcc - Vcp)$ when data of "H" is stored (when Vcc is written) and becomes $C_s \cdot (-Vcp)$ when data of "L" is stored (when 0V is written). Moreover, a charge represented by $C_s \cdot ((Vcc/2) - Vcp)$ is stored in the dummy cells DC0 and DC1 in which a voltage of Vcc/2 is written. If the bit line pair BL, /BL is precharged to a potential of Vcc/2 before the read operation, the charge on the bit lines BL, /BL becomes $C_B \cdot (Vcc/2)$, where $C_B$ is stray capacitance of the bit line BL or /BL.

FIG. 12 is a diagram showing the structure of the part related to a bit line pair extracted from the DRAM shown in FIG. 10. In FIG. 12, for example, in the case where data is read from the memory cell MC to the bit line BL, and the potential from the dummy cell DC1 is read onto the bit line /BL, the potential VBL of the bit line BL and the potential VBL, of the bit line /BL are evaluated from the following equations (1) and (2).

$$C_B \cdot (Vcc/2) + C_s \cdot [\{(1/2) \pm (1/2)\} Vcc - Vcp] = \quad (1)$$
$$C_B \cdot VBL + C_s \cdot CBL$$

Further, in the above equation (1), the sign + of the sign ± indicates the case when Vcc is written, and the sign − of the sign ± indicates the case when 0V is written.

$$C_B \cdot (Vcc/2) + C_s \cdot \{(Vcc/2) - Vcp\} = C_B \cdot VBL' + C_s \cdot VBL' \quad (2)$$

From the above equations (1) and (2), the potential difference $\Delta VBL$ (=VBL−VBL′) between the bit lines BL and /BL is as shown in the following equation (3).

$$\Delta VBL = (C_s \cdot Vcc)/\{2(C_B+C_s)\} \quad (3)$$

Now, in accordance with rapid progress in technology in recent years, there is a tendency for semiconductor memory devices to be increasingly miniaturized. A higher degree of integration of semiconductor integrated circuit devices makes the area of a memory cell MC inevitably become smaller, and the capacitance value of a memory cell capacitor Cs is reduced. However, as a conventional DRAM was constructed as described above, if a higher degree of integration reduces the capacitance value of a memory cell capacitor Cs, the read potential difference becomes smaller. As a result, a problem has arisen that the incidence of a soft error increases. Another problem has also arisen that it causes reduction of the margin of reading and malfunction of a sense amplifier.

Therefore, a semiconductor memory device has been conventionally proposed which can make larger the read potential difference between a bit line pair without making larger a memory cell capacitor. Such prior art is described in the following.

FIG. 13 is a circuit diagram showing the structure of a part of the memory cell array in the semiconductor memory device shown in Patent Laying-Open No. Sho 60-164989. In the diagram, each memory cell MC belonging to the bit line /BL has the cell plate electrode of respective memory capacitor Cs connected, through a transistor 21, to the bit line /BL. Each memory cell MC belonging to the bit line /BL has the cell plate electrode of respective memory cell capacitor Cs connected, through a transistor 22 to the bit line BL. The gate of each of the transistors 21, 22 is connected to the corresponding one of the word lines, respectively.

FIG. 14 is a circuit diagram showing the structure of a part of the memory cell array in the semiconductor memory device shown in Patent Laying-Open No. Sho 60-239993. In the diagram, each memory cell MC belonging to the bit line BL has the cell plate electrode of respective memory cell capacitor Cs connected to the bit line /BL. Each memory cell MC belonging to the bit line /BL has the cell plate electrode of respective memory cell capacitor Cs connected to the bit line BL.

In the semiconductor memory devices shown in FIGS. 13 and 14, the one and the other electrodes of the memory cell capacitor Cs of each memory cell MC are connected to the one and the other bit lines of the corresponding bit line pair, respectively. As a result, when data is read from the memory cell MC, the potentials of the bit lines BL and /BL change in the directions opposite to each other, and the read potential difference increases. Therefore, there is an advantage that the incidence of soft error can be decreased, the margin of reading is increased and a semiconductor memory device with less malfunction is obtained.

On the contrary, the semiconductor memory devices shown in FIGS. 13 and 14 has a problem as described in the following.

First, since in the semiconductor memory device shown in FIG. 13, each memory cell MC includes three elements, there has been a problem that the area of the memory cell becomes large and it prevents a higher degree of integration. Besides, since the semiconductor memory device shown in FIG. 13 has the output (having a large potential difference) of a sense amplifier (not shown) directly applied to the memory cell capacitor Cs when data is rewritten in a memory cell MC after reading data from the memory cell MC has been ended, there has been a problem that a high electric field is applied to the memory cell capacitor Cs so that the dielectric film of the memory cell capacitor Cs may be broken. To solve the latter problem, it is considered to increase the thickness of the dielectric film of the memory cell capacitor Cs; however, it causes the capacitance value of the memory cell capacitor Cs to become small and the stored charge amount in the memory cell capacitor to be reduced. It is also considered to decrease the voltage applied to the memory cell capacitor Cs by some means; however, it makes control complicated.

On the other hand, in the semiconductor memory device shown in FIG. 14, the output of the sense amplifier (not shown) is also directly applied to the memory cell capacitor Cs, so that a problem has arisen that a high electric field is applied to the memory cell capacitor Cs in the same manner as in the semiconductor memory device shown in FIG. 13.

SUMMARY OF THE INVENTION

An object of the present invention is to provide a semiconductor memory device having a large read potential difference while having a small area and high reliability.

The semiconductor memory device according to the present invention comprises a plurality of word lines, a plurality of bit lines crossing these word lines and arranged as complementary bit line pairs, a plurality of memory cells arranged at respective crossings of the word lines and the bit lines, and a plurality of cell plate lines corresponding, respectively, to the bit line pairs.

Each memory cell includes transfer means and a capacitor for storing an information charge. The capacitor of each memory cell has a first plate connected, through the corresponding transfer means, to one bit line of a corresponding bit line pair and a second plate connected to the corresponding cell plate line. The semiconductor memory device according to the invention further comprises first and second switches, selector means, transfer control means and switch control means. The first and second switches are connected between the cell plate line and the first bit line of each bit line pair and between the cell plate line and the second bit line of each bit line pair, and each of the first and second switches are common to the plurality of memory cells connected to each bit line pair. The selector means selects a word line and a bit line corresponding to a particular memory cell. Transfer control means is responsive to the selector means to control the transfer means of the particular memory cell on one of the first and second bit lines of a selected bit line pair. Switch control means controls the first and second switches to connect the cell plate line to the other one of the first and second bit lines of the selected bit line pair.

In the present invention, the stored information of a selected memory cell is read, through the corresponding transfer means, to one of the first and second bit lines of a selected bit line pair. Besides the first and second switches are controlled by the switch control means, and the cell plate line is connected to the other one of the first and second bit lines of the selected bit line pair. As a result, the respective potentials of the first and the second bit lines of the selected bit line pair changes in the directions opposite to each other, and the read potential difference increases.

Furthermore, since the present invention comprises memory cells each implemented with two elements, transfer means and a capacitor, the area of the memory cell is small, and it is suitable for a higher degree of integration.

Furthermore, according to the present invention, each cell plate line is connected, through the first or the second switch means, to the first or the second bit line of a corresponding bit line pair, and the first and second switches are controlled by the switch control means. Therefore, each cell plate line and the bit line are disconnected after the switch control means ends the control operation, and it is possible to prevent the high-voltage output of the sense amplifier from being directly applied to the capacitor of each memory cell. As a result, it is possible to prevent the dielectric film of the memory cell capacitor from being broken by the high voltage, and to obtain a semiconductor memory device with high reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
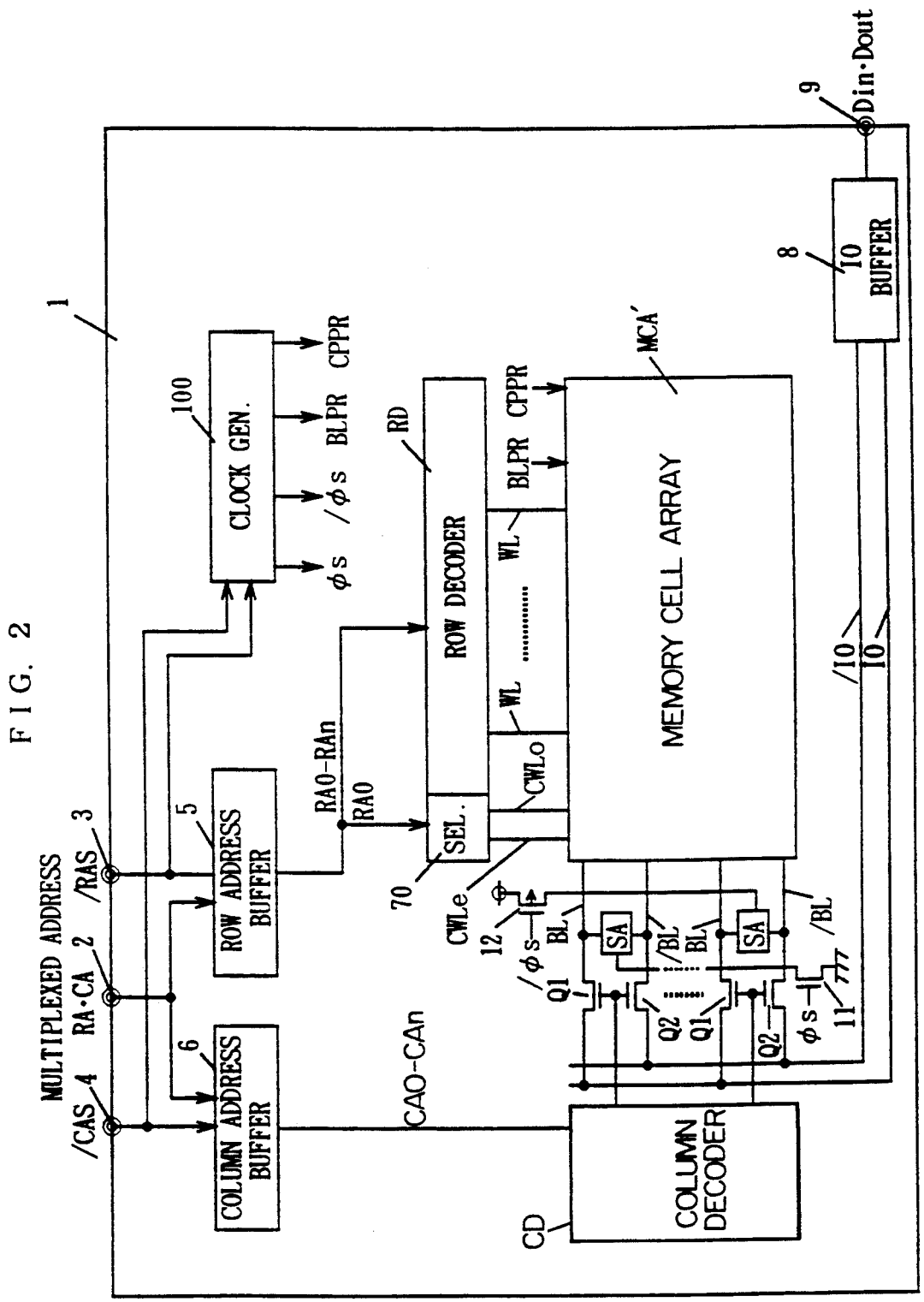
FIG. 2 is a block diagram showing the whole structure of the semiconductor memory device according to one embodiment of the invention.

FIG. 2 is a block diagram showing the whole structure of the DRAM according to one embodiment of the invention. Specifically, the embodiment shown in FIG. 2 is of the same structure as that of the conventional DRAM shown in FIG. 9 except for the following respects and, therefore, the corresponding portions are given the same reference numerals and description of them is omitted.

In FIG. 2, the least significant bit signal RA0 of the row address signal RA0 - RAn obtained from row address buffer 5 is supplied to a selector circuit 70. The selector circuit 70 is responsive to the least significant bit signal RA0 to selectively drive either of control signal lines CWLe or CWLo. The control signal lines CWLe and CWLo are connected to a memory cell array MCA'.

The row address strobe signal /RAS and the column address strobe signal /CAS which are supplied as inputs from signal input terminals 3, 4 are supplied to a clock generating circuit 100. The clock generating circuit 100 is responsive to the supplied row address strobe signal /RAS and the column address strobe signal /CAS to output clock signals BLPR, CPPR, $\phi$s, and /$\phi$s. The clock signals BLPR and CPPR are supplied to the memory cell array MCA'. The clock signals $\phi$s and /$\phi$s are supplied to the gates of transistors 11, 12 changing the sense amplifiers SA in the active state.

Figure 1:
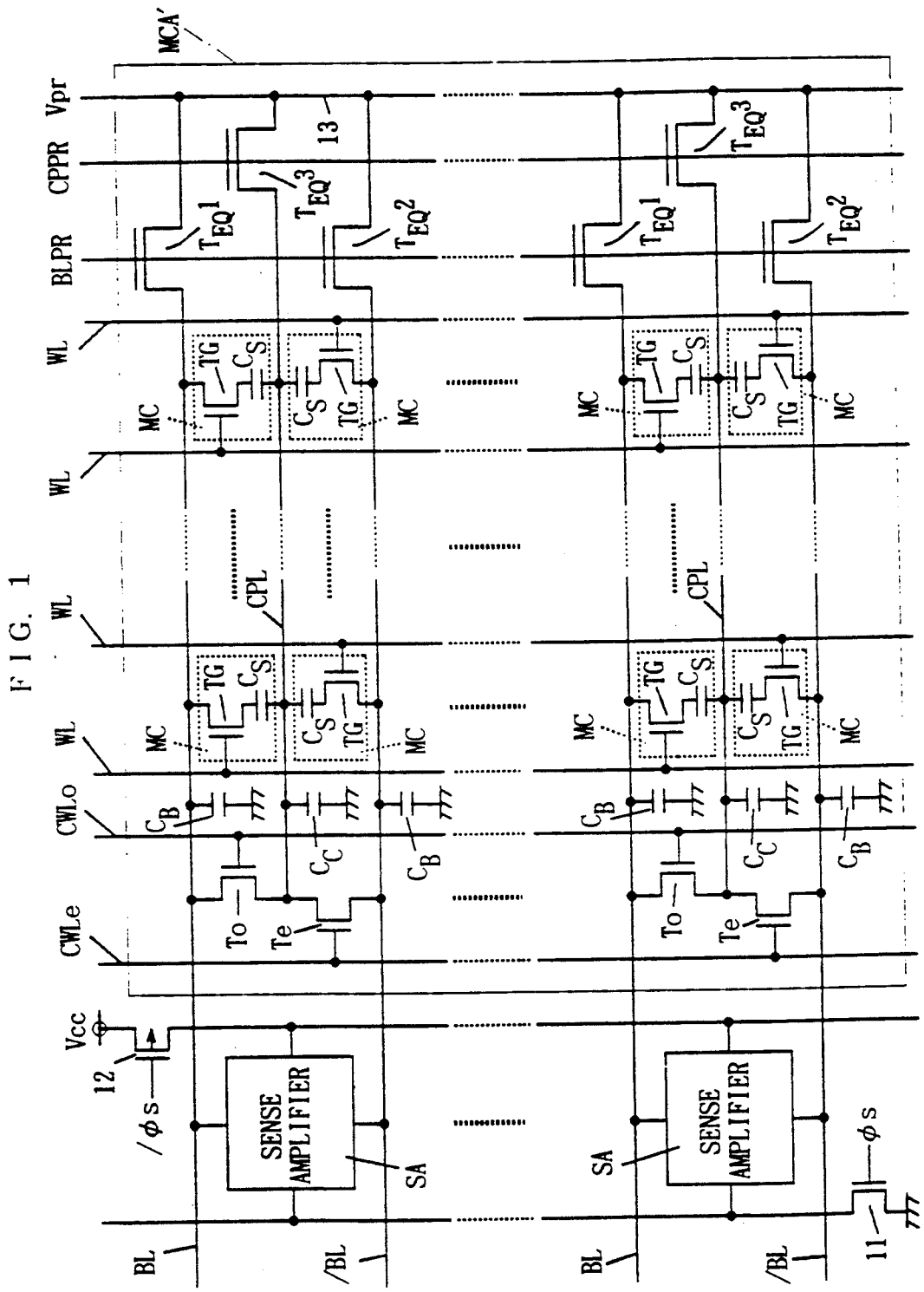
FIG. 1 is a circuit diagram showing in detail the structure of the main portion of the semiconductor device according to one embodiment of the invention.

FIG. 1 is a circuit diagram showing in further detail the structure of the peripheral portion of the memory cell array extracted from the embodiment shown in FIG. 2 and constituting the essential features of the invention.

In FIG. 1, one end of each cell plate line CPL is connected, through a transfer gate To implemented with a N channel MOS transistor, to a bit line BL and, through a transfer gate Te also implemented with a N channel MOS transistor, to a bit line /BL. The gates of the transfer gates To and Te are connected, respectively, to the control signal lines CWLo and CWLe, and on-off control of the same is made by the selector circuit 70 shown in FIG. 2.

Besides, the other end of each cell plate line CPL is connected, through a transfer gate $T_{EQ}3$ implemented with a N channel MOS transistor, to a precharge line 13. The transfer gate $T_{EQ}3$ has its on-off controlled by clock signal CPPR from the clock generating circuit 100 shown in FIG. 2. A voltage Vpr for precharging is applied to precharge line 13. Moreover, the cell plate line CPL has a stray capacitance Cc.

Figure 10:
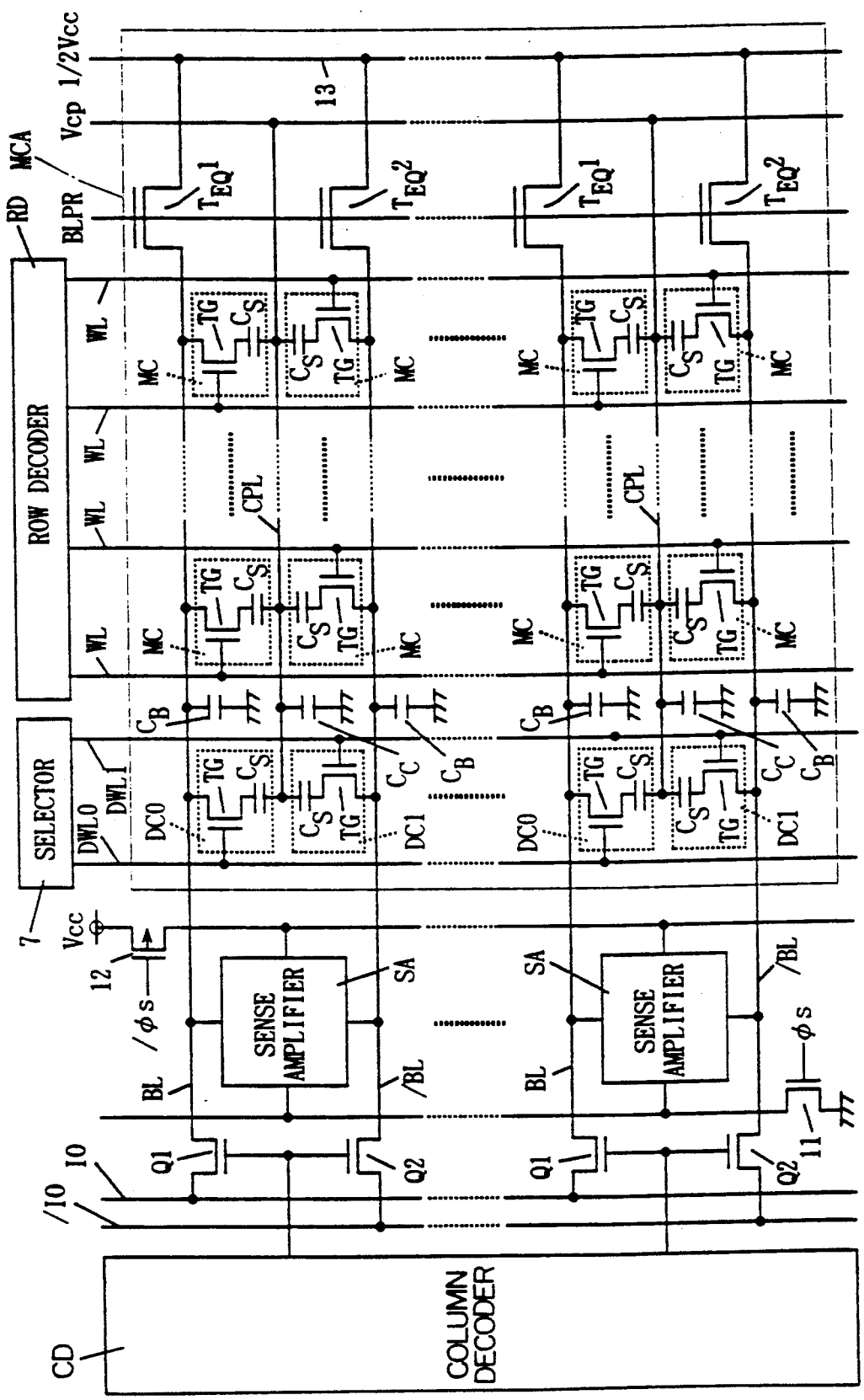
FIG. 10 is a circuit diagram showing in more detail the structure of the memory cell array and its peripheral portion in the conventional DRAM shown in FIG. 9.
Figure 11:
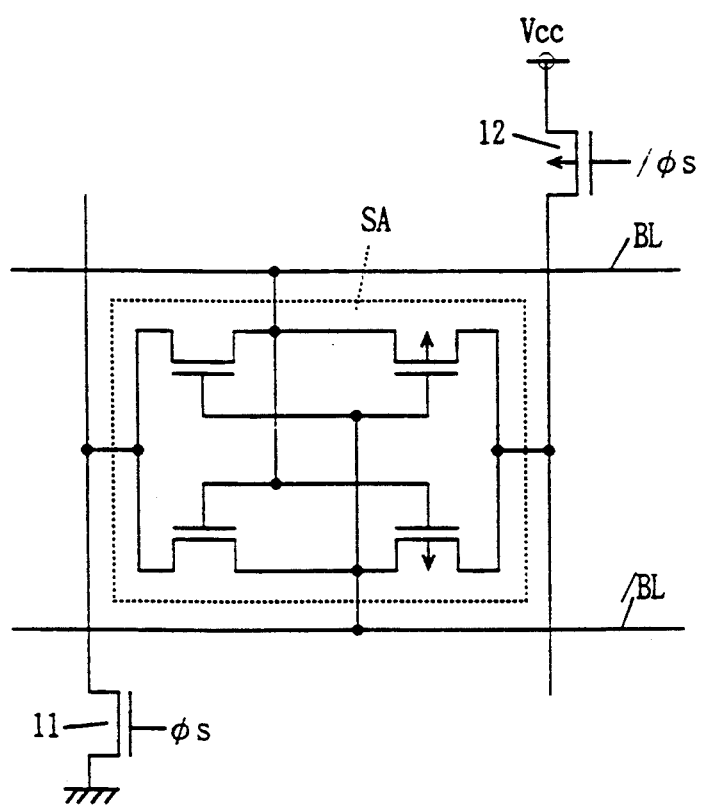
FIG. 11 is a circuit diagram showing a general structure of the sense amplifier usable in the conventional semiconductor memory device and in the semiconductor memory device according to an embodiment of the invention.
Figure 12:
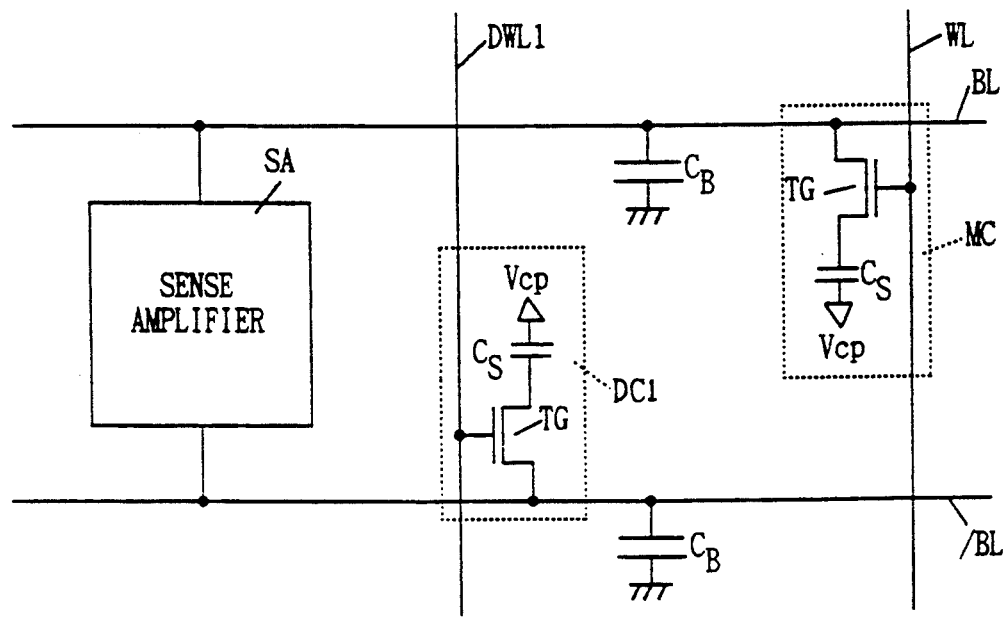
FIG. 12 is a circuit diagram showing the structure of a further portion of the conventional DRAM shown in FIG. 10.

Furthermore, this embodiment does not require the dummy cells which have been provided in the conventional DRAM shown in FIG. 10, as clarified in FIG. 1.

Figure 3:
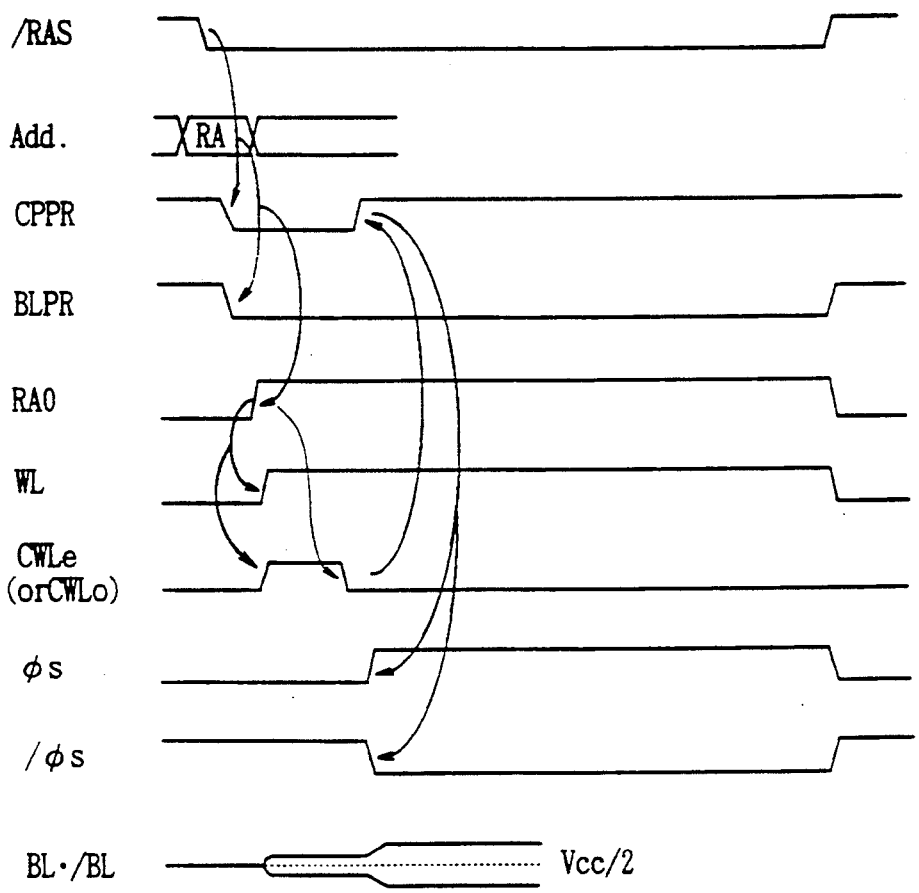
FIG. 3 is a timing chart for explaining the operation during information reading in the embodiment shown in FIG. 1 and FIG. 2.

FIG. 3 is a timing chart for explaining the operation during the read operation of the embodiment shown in FIGS. 1 and 2. With reference to FIG. 3, the operation of the embodiment shown in FIGS. 1 and 2 is described in the following.

As shown in FIG. 3, when data is read, the clock signals CPPR and BLPR have already attained "H" level. As a result, all of the transfer gates $T_{EQ}1-T_{EQ}3$ are on, and the bit lines BL, /BL and the cell plate line CPL are charged to a voltage Vpr. Thereafter, if the level of the row address strobe signal /RAS becomes the active level, i.e. "L", the levels of both the clock signals CPPR and BLPR become "L" level before the row decoder RD selectively drives the word line.

If either one of the word lines is selected by the row decoder RD, and the potential of the word line WL becomes "H" level, the stored information in each memory cell MC connected to the word line WL is read, respectively, to a corresponding bit line BL (or /BL). More specifically, the transfer gate TG in the memory cell MC turns on, movement of charge occurs between the memory cell capacitor Cs and the stray capacitance $C_B$ of the bit line BL (or /BL), and the potential of the bit line BL (or BL) changes. With the word line WL being driven, the potential of the control signal line CWLe (or CWLo) is raised to "H". This causes the transfer gate Te (or To) to turn on and the cell plate line CPL and the bit line BL (or BL) to be connected, As a result, movement of charge occurs between the memory cell capacitor Cs and the stray capacitance $C_B$ of the bit line /BL (or BL).

As described above, when a memory cell belonging to the bit line BL is selected, the cell plate electrode of the memory cell capacitor Cs is connected, through the transfer gate Te, to the opposite bit line /BL. Conversely, when a memory cell belonging to the bit line /BL is selected, the cell plate electrode of the memory cell capacitor Cs is connected to the opposite bit line BL. This causes the read potential difference between the bit line BL and /BL to be increased.

Thereafter, the potential of the control signal line CwLe is lowered to "L". The clock signal $\phi s$ is raised to "H" and the clock signal $/\phi s$ is lowered to "L", and the sense amplifier is activated. This causes the potential difference read to the bit line pair BL, /BL to be amplified by the sense amplifier SA. The subsequent operation is the same as that of the conventional DRAM shown in FIGS. 9 and 10.

Now, the read potential difference of the bit lines BL and /BL in the above-described case will be considered. It is assumed that Vpr=Vcc/2, and a voltage of "H" is written in the selected memory cell MC. In this case, the following equations (4) and (5) are obtained by the principle of conservation of charge.

$$C_B \cdot (Vcc/2) + Cs \cdot (Vcc/2) = C_B \cdot VBL + Cs \cdot (VBL - VBL') \quad (4)$$

$$(C_B + Cc) \cdot (Vcc/2) - Cs \cdot (Vcc/2) = \quad (5)$$
$$(C_B + Cc) \cdot VBL' + Cs \cdot (VBL' - VBL)$$

From the above equations (4) and (5), the potential difference $\Delta VBL$ between the bit line BL and /BL becomes as in the following equation (6).

$$\Delta VBL = (Cs \cdot Vcc)/2[\{C_B \cdot (C_B + Cc)/(2C_B + Cc)\} + Cs] \quad (6)$$

In the above equation (6), it is seen that the factor of the $C_B$ in the first term of the denominator is smaller, that is to say, the read potential difference is larger in comparison with the above described equation (3). For example, if it is assumed that $C_B/Cs=10$ and $C_B/Cc=2$, the read potential difference becomes about 57% larger than in the conventional DRAM shown in FIGS. 9 and 10. Furthermore, in practice, if it is considered that the junction capacitance of the cell plate line CPL is considerably smaller than the stray capacitance $C_B$ of the bit line, the value of $C_B/Cc$ seems to become much larger.

Figure 9:
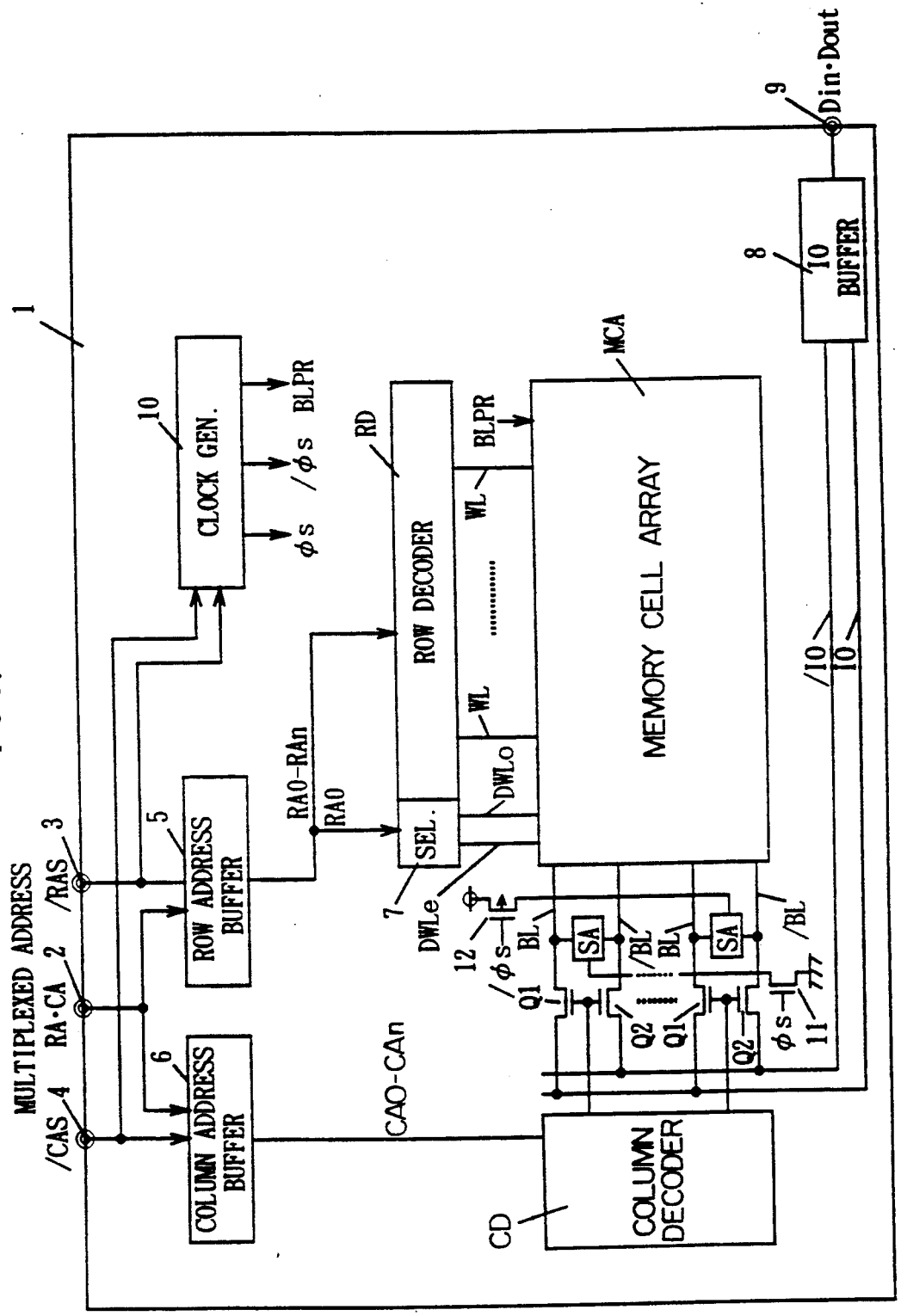
FIG. 9 is a block diagram showing the whole structure of the conventional general DRAM.

FIGS. 4 and 5 are schematic diagrams for explaining the reason why the read potential difference in the DRAM in the embodiment shown in FIGS. 1 and 2 is larger than that in the conventional DRAM shown in FIGS. 9 and 10. With reference to FIGS. 4 and 5, the reason why the read potential difference becomes larger will be described in the following.

Figure 4A:
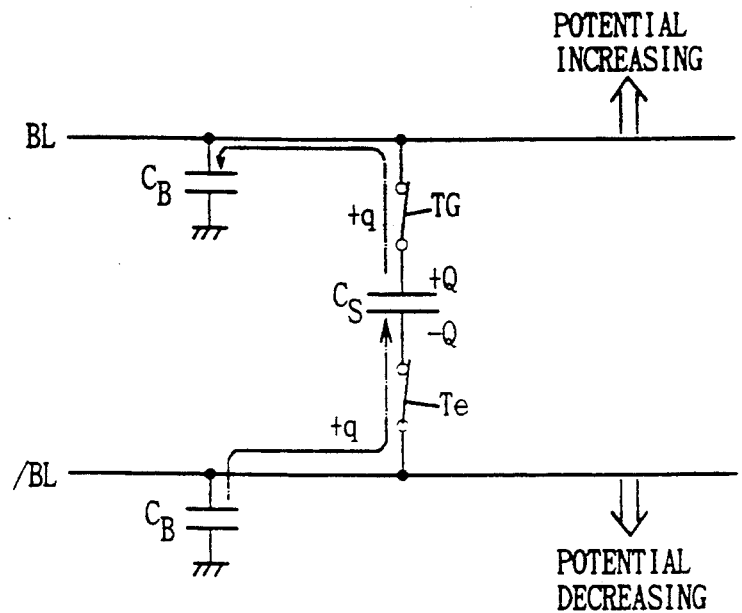
FIG. 4(a) and 4(b) show the moving states of charge during the read operation of an "H" state memory cell in the embodiments of FIGS. 1 and 9 respectively.
Figure 4B:
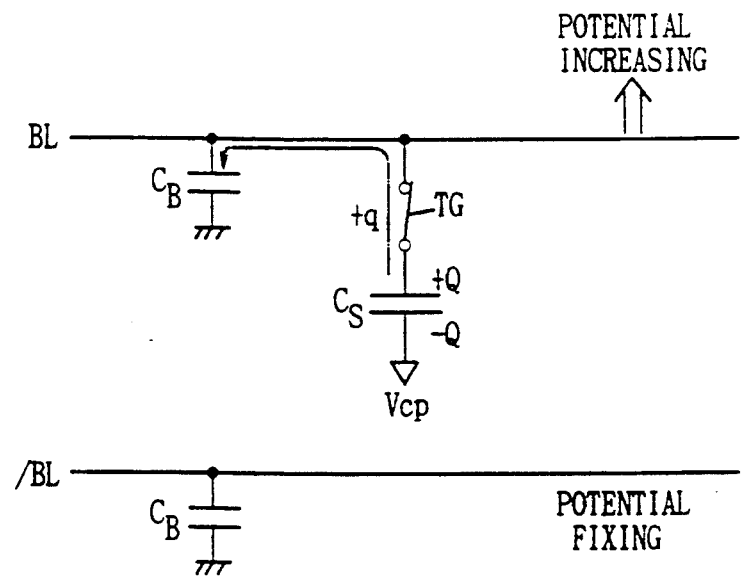

FIG. 4 shows the moving states of charge during the read operation in the case where a voltage of "H" is written in the memory cell capacitor Cs, and specifically, FIG. 4(a) shows the case of the embodiment shown in FIGS. 1 and 2, and FIG. 4(b) shows the case of the conventional DRAM shown in FIGS. 9 and 10. With reference to FIG. 4(a), if the memory cell capacitor Cs is connected, through the transfer gate TG, to the bit line BL, a charge +q, a part of the charge +Q stored in the memory cell capacitor Cs, moves to the stray capacitance $C_B$ of the bit line BL. Consequently, the potential of the bit line BL rises. On the other hand, the cell plate electrode of the memory cell capacitor Cs is connected, through the transfer gate Te, to the bit line /BL. Therefore, a charge +q flows from the stray capacitance $C_B$ of the bit line /BL to the cell plate electrode of the memory cell capacitor Cs in order to compensate for the flow of a charge +q from the memory cell capacitor Cs to the bit line BL. As a result, the potential of the bit line /BL lowers. In contrast, since the conventional DRAM has the cell plate electrode of the memory cell capacitor Cs connected to the power source as shown in FIG. 4(b), the potential of the bit line /BL is fixed to the precharge potential.

Figure 5A:
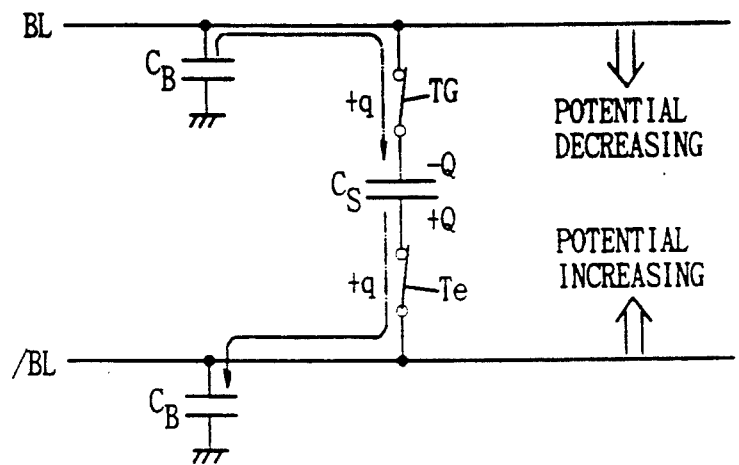
FIG. 5(a) and 5(b) show the moving states of charge during the read operation of an "H" state memory cell in the embodiments of FIGS. 1 and 9 respectively.
Figure 5B:
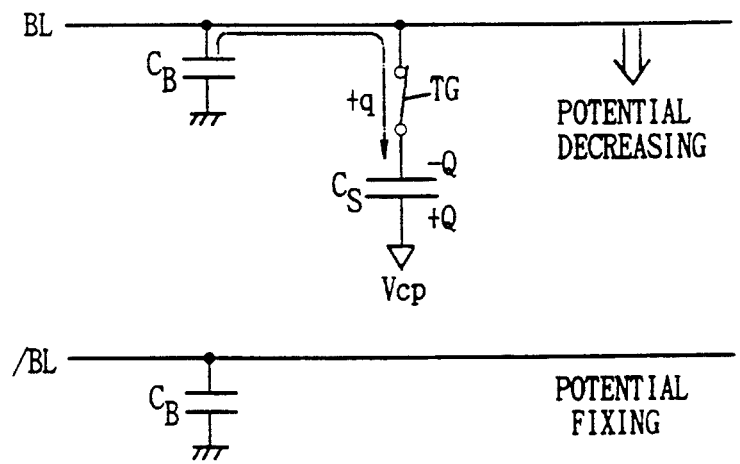

FIG. 5 shows the moving states of charge during the read operation in the case where a voltage of "L" is written in the memory cell, and specifically, FIG. 5(a) shows the case of the embodiment shown in FIGS. 1 and 2, and FIG. 5(b) shows the case of the conventional DRAM shown in FIGS. 9 and 10. With reference to FIG. 5(a), if the memory cell capacitor Cs is connected, through the transfer gate TG, to the bit line BL, a part of the charge stored in the stray capacitance $C_B$ of the bit line BL, +q, flows into the memory cell capacitor Cs. This causes the potential of the bit line BL to lower. On the other hand, the cell plate electrode of the memory cell capacitor Cs is connected, through the transfer gate Te, to the bit line /BL. Therefore, a charge +q flows from the cell plate electrode of the memory cell capacitor Cs to the stray capacitance $C_B$ of the bit line /BL to keep balance with the charge +q flowing from the bit line BL to the memory cell capacitor Cs. Consequently, the potential of the bit line /BL rises. In contrast, since the conventional DRAM has the cell plate of the memory cell capacitor Cs connected to the power source as shown in FIG. 5(b), the potential of the bit line /BL is fixed to the precharge potential.

As described above, in the embodiments shown in FIGS. 1 and 2, as a result of connecting the cell plate electrode of the memory cell capacitor Cs to the bit line, which has been conventionally fixed to the reference potential when information is read from the memory cell, the potentials of the bit lines BL and /BL are changed in the directions opposite to each other. As a result, the read potential difference becomes larger than that of the conventional DRAM.

Furthermore, in the embodiment shown in FIGS. 1 and 2, if information is read from the memory cell MC, the cell plate line CPL is disconnected from the bit line before the sense amplifier SA is activated, so that the memory cell capacitor Cs is not supplied with a high electric field and reliability is enhanced. More specifically, since the embodiment shown in FIGS. 1 and 2 has the cell plate lines CPL connected to the precharge line 13 after being disconnected from the bit lines, a voltage of Vpr (=Vcc/2) is applied to the memory cell capacitor Cs after activation of the sense amplifier SA.

Figure 13:
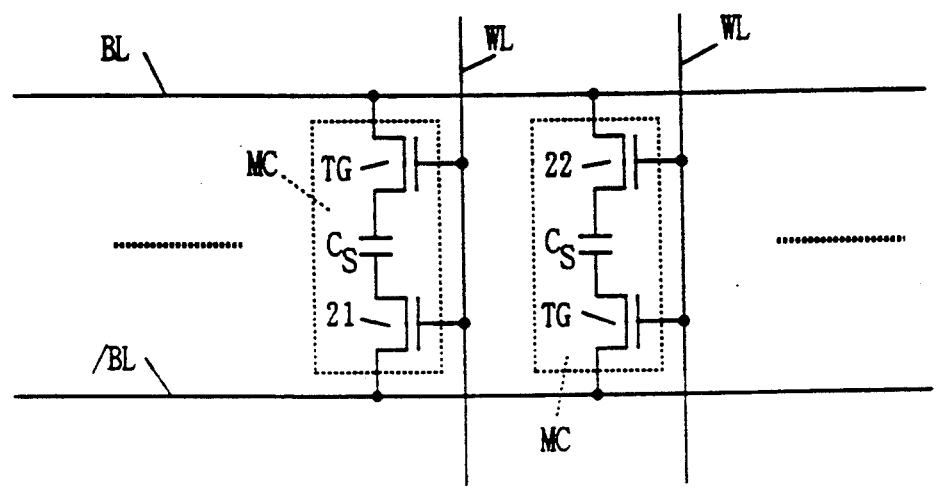
FIG. 13 is a circuit diagram showing another structure of the conventional semiconductor memory device.
Figure 14:
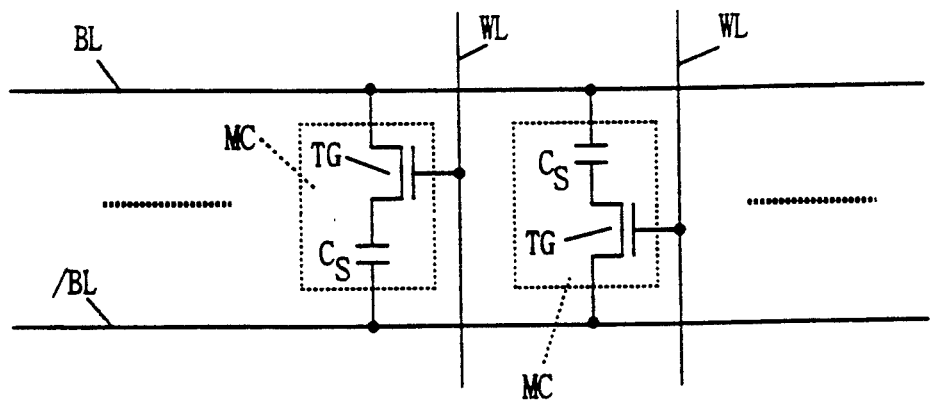
FIG. 14 is a circuit diagram showing still another structure of the conventional semiconductor memory device.

Moreover, since the embodiment shown in FIGS. 1 and 2 has each memory cell MC implemented with two elements, an increase in the area of the memory cell is not caused as in the conventional semiconductor memory device shown in FIG. 13.

Figure 6:
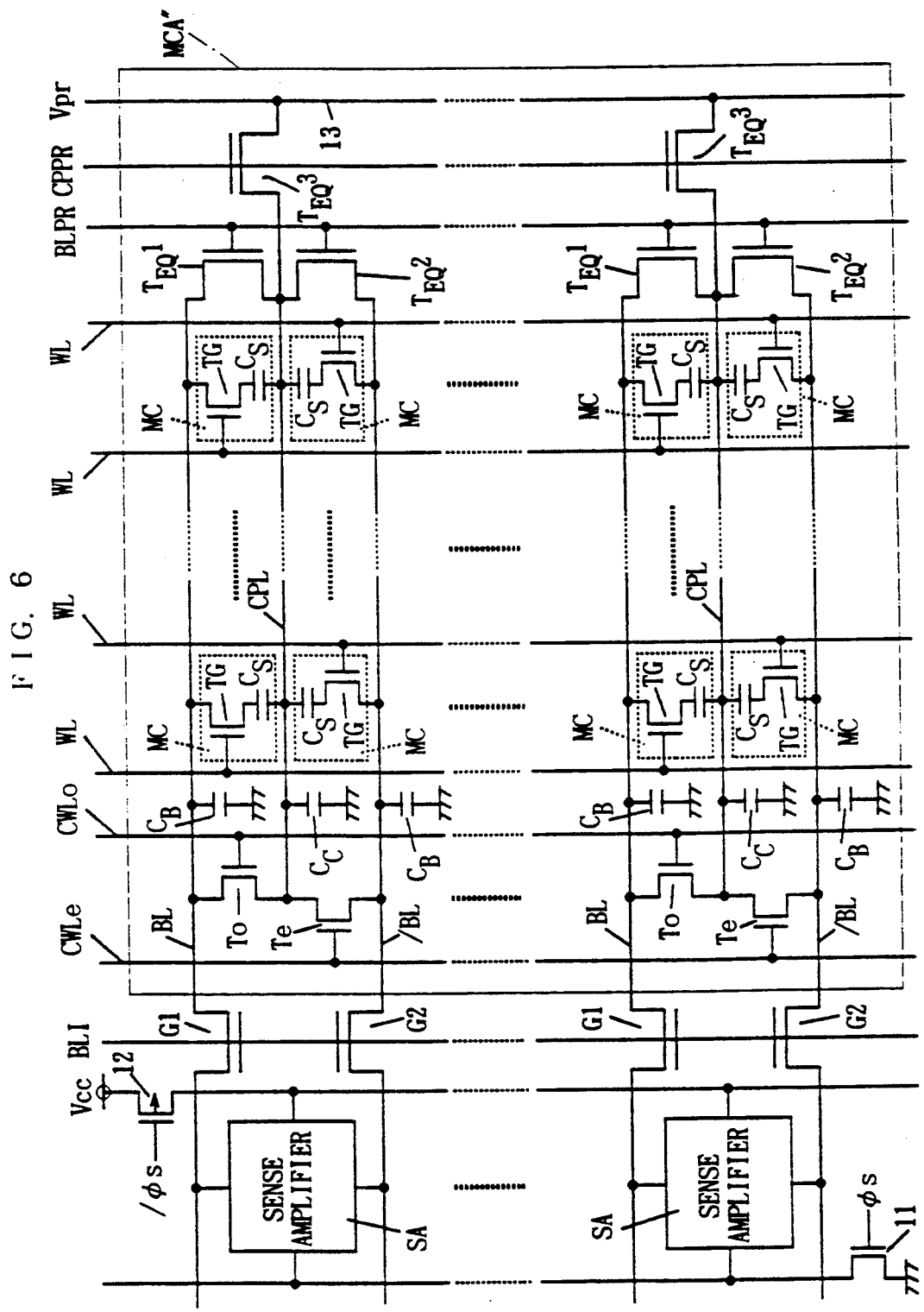
FIG. 6 is a circuit diagram showing in detail the structure of a main portion, of the semiconductor memory device according to another embodiment of the invention.

FIG. 6 is a circuit diagram showing the structure of the memory cell array and its peripheral portion in the semiconductor memory device in another embodiment of the invention. In the embodiment in FIG. 6, a transfer gate G1 implemented with a N channel MOS transistor is interposed between each bit line BL and a corresponding sense amplifier SA. Besides, a transfer gate G2 implemented with N channel MOS transistor is interposed between each bit line /BL and a corresponding sense amplifier SA. A clock signal BL1 is supplied to each gate of these transfer gates G1, G2. On the other hand, in the embodiment shown in FIG. 6, each bit line BL is connected, through a corresponding transfer gate $T_{EQ}1$, to a corresponding cell plate line CPL. Besides, each bit line BL is connected, through a corresponding transfer gate $T_{EQ}2$, to a corresponding cell plate line CPL. The other parts of the structure of the embodiment shown in FIG. 6 are the same as the embodiment shown in FIG. 1, so that the same reference numerals are given to the corresponding parts and description thereof is omitted.

Figure 7:
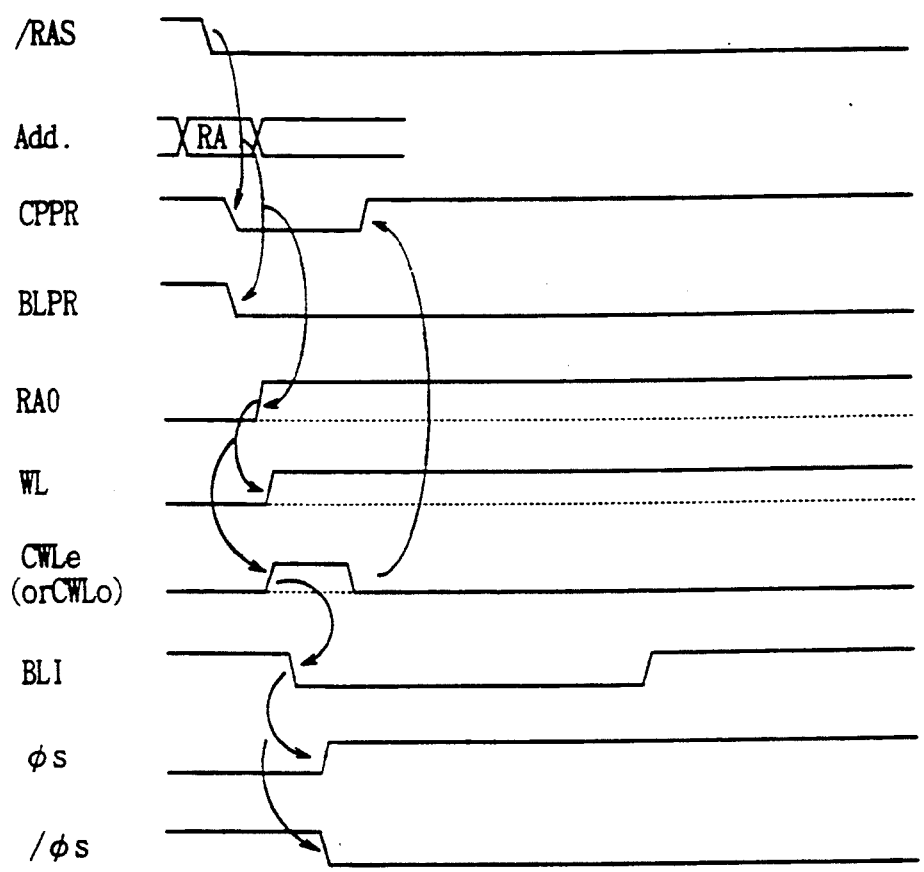
FIG. 7 is a timing chart for explaining the operation during information reading in the embodiment shown in FIG. 6.

FIG. 7 is a timing chart for explaining the operation of the embodiment shown in FIG. 6 during the read operation. With reference to FIG. 7, the operation of the embodiment shown in FIG. 6 will be explained in the following.

In the embodiment shown in FIG. 6, after a word line WL is selected and the read potential difference appears on each bit line pair BL, /BL, the potential of the clock signal BL1 is made "L". This electrically separates each bit line pair BL, /BL and each sense amplifier SA. Then, the levels of the clock signals $\phi s$, $/\phi s$ are brought to "H" and "L", respectively, and each sense amplifier SA is activated.

In the embodiment shown in FIG. 6, the sense amplifier SA can be activated before the bit line BL or /BL and the cell plate line CPL are electrically disconnected by the transfer gate To or Te. This is because the output voltage of the sense amplifier SA is not applied to the memory cell capacitor Cs, even if the sense amplifier SA is activated before the bit line and the cell plate line are disconnected, since each bit line pair BL, /BL and the sense amplifier SA are electrically disconnected by the transfer gates G1, G2. Therefore, in the embodiment shown in FIG. 6, since it is possible to activate the sense amplifier SA in earlier timing in comparison with the embodiment shown in FIGS. 1, 2, high-speed reading becomes possible. Besides, in the embodiment shown in FIG. 6, the capacitance of the sense node becomes smaller when the sense amplifier SA is activated, and this also contributes to high-speed operation. Besides, in the embodiment shown in FIG. 6, since the capacitance value of one sense node and the other sense node of the sense amplifier SA are approximately equal, it also becomes possible to prevent malfunction of the sense amplifier SA.

Furthermore, in the embodiment shown in FIG. 6, the bit lines BL, /BL are precharged through the cell plate line CPL. The other operation of the embodiment shown in FIG. 6 is the same as that of the embodiment shown in FIGS. 1, 2.

The invention is applicable not only to a semiconductor memory device of the folded bit line type but also to a semiconductor memory device of the open bit line type as described above. Such an embodiment is shown in FIG. 8.

Figure 8:
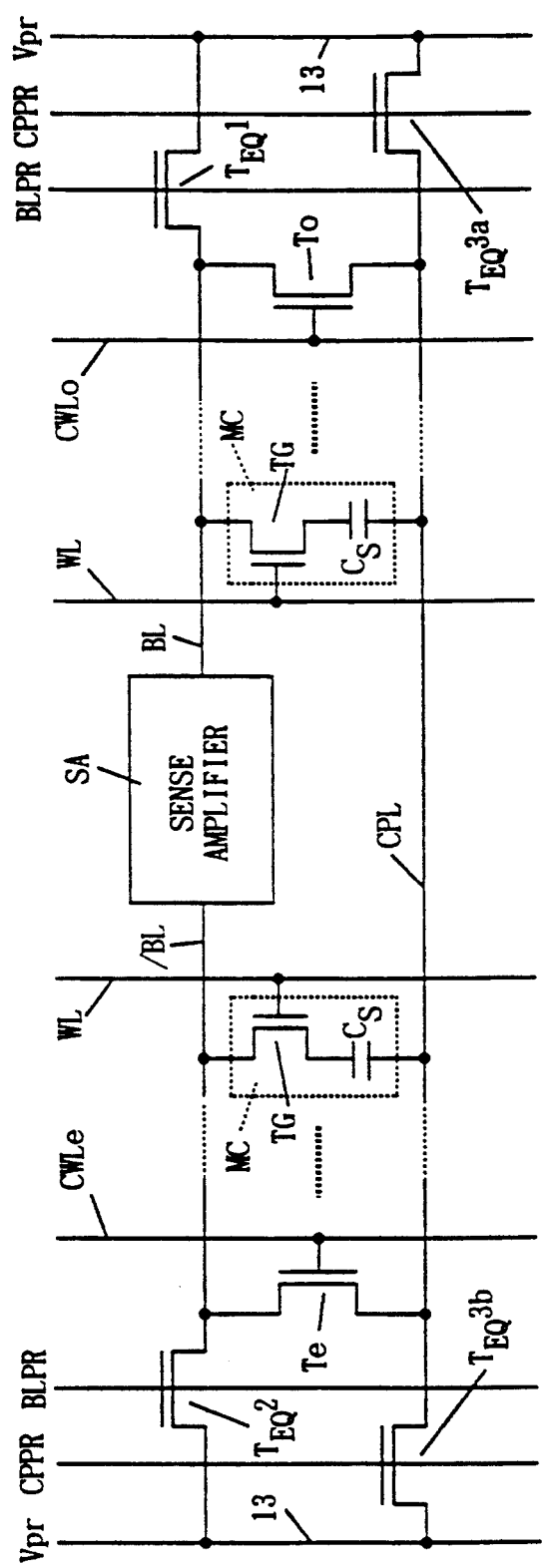
FIG. 8 is a circuit diagram showing the structure of the main portion of the semiconductor memory device according to still another embodiment of the invention.

In the embodiment shown in FIG. 8, a bit lines BL, /BL constituting a pair with a sense amplifier SA as the central figure are symmetrically arranged on the right and left sides of a sense amplifier SA. Memory cells MC are arranged at the crossings of a bit line BL and each word line WL and of a bit line /BL and each word line WL, respectively. The cell plate electrode of a memory cell capacitor Cs in each memory cell MC is connected to the cell plate line CPL. A transfer gate To is interposed between the bit line BL and the cell plate line CPL, and a transfer gate To is interposed between the bit line /BL and the cell plate line CPL. The bit line BL is connected, through a transfer gate $T_{EQ}1$, to a precharge line 13, and the bit line /BL is connected, through a transfer gate $T_{EQ}2$, to a precharge line 13. The cell plate line CPL has its one end connected, through a transfer gate $T_{EQ}3a$, to a precharge line 13, and the other end connected, through a transfer gate $T_{EQ}3b$ to a precharge line 13. The gate of the transfer gate To is connected to the control signal line CWLo, and the gate of the transfer gate Te is connected to a control signal line CWLe. A clock signal BLPR is supplied to each gate of the transfer gate $T_{EQ}1$ and $T_{EQ}2$. A clock signal CPPR is supplied to each gate of the transfer gate $T_{EQ}3a$, $T_{EQ}3b$. Specifically, although FIG. 8 shows the structure of a bit line pair, a plurality of bit line pairs are normally arranged in parallel, and the structure of each bit line pair is the same as that shown in FIG. 8.

The embodiment shown in FIG. 8 is different from the embodiment shown in FIGS. 1, 2 only in the spatial arrangement of the bit lines BL, /BL. Therefore, in the embodiment shown in FIG. 8, the operation is performed in accordance with the timing chart shown in FIG. 3, and the operation does not differ from that in the embodiment shown in FIGS. 1, 2. Therefore, description of the operation in the embodiment shown in FIG. 8 is omitted.

As described above, according to the present invention, since when stored information in a memory cell is read, the first plate of the memory cell capacitor is connected to one bit line of a corresponding bit line pair and the second plate is connected to the other bit line of a corresponding bit line pair, it is possible to make larger the read potential difference without making larger the capacitance value of the memory cell capacitor.

Moreover, since the invention enables each memory cell to be implemented with less elements in comparison with the conventional DRAM, the area of the memory cell can be reduced, and it is suitable for a higher degree of integration.

In addition, according to the invention, the output voltage of the sense amplifier is not directly applied to the memory cell capacitor, so that the dielectric film can be prevented from being broken by a high voltage, and as a result, a semiconductor memory device having high responsibility is provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of word lines, and a plurality of bit lines crossing said word lines and arranged as complementary bit line pairs,
   a plurality of memory cells arranged at respective crossings of said word lines and said bit lines,
   a plurality of cell plate lines corresponding, respectively, to said bit line pairs,
   each said memory cell comprising a transfer means and a capacitor for storing an information charge, the capacitor of each memory cell having a first plate connected, through corresponding said transfer means, to one bit line of a corresponding bit line pair and a second plate connected to the corresponding cell plate line,
   first and second switches connected, respectively, between said cell plate line and said first bit line and between said cell plate line and said second bit line of each bit line pair, each of said first and second switches being common to a plurality of memory cells connected to each bit line pair; and
   selector means for selecting a word line and a bit line corresponding to a particular memory cell,
   transfer control means responsive to said selecting means for controlling the transfer means of the particular memory cell on one of said first and second bit lines of a selected bit line pair; and
   switch control means for controlling said first and second switches to connect said cell plate line to the other one of said first and second bit lines of said selected bit line pair.

2. The semiconductor memory device according to claim 1 further comprising:
   means for precharging each of said bit lines and each of said cell plate lines to the same potential.

3. The semiconductor memory device according to claim 2 further comprising:
   a plurality of sense amplifier means, each provided to each of said bit line pairs, for amplifying the potential difference between said first and second bit lines of the corresponding bit line pairs, respectively.

4. A semiconductor memory device according to claim 3 further comprising:
   sense amplifier control means for controlling activation/inactivation of each of said sense amplifier means.

5. A semiconductor memory device according to claim 4, wherein
   said sense amplifier control means activates each of said sense amplifiers after said switch control means has ended its control operation.

6. A semiconductor memory device according to claim 4 further comprising:
   means for electrically disconnecting each of said bit lines and each of said sense amplifier means after said switch means starts its control operation.

7. A semiconductor memory device according to claim 6 further comprising:
   said sense amplifier control means activates each of said sense amplifier before said switch means ends its control operation.

8. A semiconductor memory device according to claim 1, wherein
   each of said bit line pair has a folded bit line structure.

9. A semiconductor memory device according to claim 1, wherein
   each of said bit line pairs has an open bit line structure.

* * * * *